(12) United States Patent
Nagrani et al.

(10) Patent No.: US 7,388,794 B2
(45) Date of Patent: Jun. 17, 2008

(54) INDIVIDUAL I/O MODULATION IN MEMORY DEVICES

(75) Inventors: Mehul Nagrani, Boise, ID (US); Victor Wong, Boise, ID (US); Jeffrey P. Wright, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/447,272

(22) Filed: Jun. 6, 2006

(65) Prior Publication Data

US 2006/0221671 A1 Oct. 5, 2006

Related U.S. Application Data

(63) Continuation of application No. 10/766,004, filed on Jan. 29, 2004, now Pat. No. 7,082,064.

(51) Int. Cl.
*G11C 7/00* (2006.01)

(52) U.S. Cl. ............. 365/194; 365/189.05; 365/230.06

(58) Field of Classification Search ................ 365/194, 365/189.05, 230.06, 230.08
See application file for complete search history.

(56) References Cited

U.S. PATENT DOCUMENTS

| 5,457,661 | A | 10/1995 | Tomita et al. |
| 5,631,871 | A | 5/1997 | Park et al. |
| 6,304,509 | B1 | 10/2001 | Hirobe et al. |
| 6,359,815 | B1 | 3/2002 | Sato et al. |
| 6,469,540 | B2 | 10/2002 | Nakaya |

*Primary Examiner*—Gene N. Auduong
(74) *Attorney, Agent, or Firm*—Dickstein Shapiro LLP

(57) ABSTRACT

A DRAM circuit with reduced power consumption and in some circumstances faster memory array access speed. Input/output lines connected to a memory array are sensed according to their capacitance/length in comparison to a threshold capacitance/length. The input/output lines that are shorter, or less capacitive, than the threshold are sensed sooner than those input/output lines that are longer, more capacitive, than the threshold. Since shorter input/output lines are sensed sooner, they require less power and may be accessed faster.

17 Claims, 5 Drawing Sheets

INDIVIDUAL I/O MODULATION IN MEMORY DEVICES

CROSS-REFERENCE TO RELATED APPLICATIONS

This application is a continuation of application Ser. No. 10/766,004, filed Jan. 29, 2004, now U.S. Pat. No. 7,082,064 which is incorporated herein by reference in its entirety.

FIELD OF THE INVENTION

The invention relates to memory circuits. In particular, the invention relates to improving power consumption and memory access speed in a dynamic random access memory (DRAM) circuit.

BACKGROUND OF THE INVENTION

An essential semiconductor device is semiconductor memory, such as a random access memory (RAM) device. A RAM device allows the user to execute both read and write operations on its memory cells. Typical examples of RAM devices include dynamic random access memory (DRAM) and static random access memory (SRAM).

DRAM is a specific category of RAM containing an array of individual memory cells, where each cell includes a capacitor for holding a charge and a transistor for accessing the charge held in the capacitor. The transistor is often referred to as the access transistor or the transfer device of the DRAM cell.

FIG. 1 illustrates a portion of a DRAM memory circuit containing two neighboring DRAM cells 10. Each cell 10 contains a storage capacitor 14 and an access field effect transistor or transfer device 12. For each cell, one side of the storage capacitor 14 is connected to a reference voltage (illustrated as a ground potential for convenience purposes). The other side of the storage capacitor 14 is connected to the drain of the transfer device 12. The gate of the transfer device 12 is connected to a signal line known in the art as a word line 18. The source of the transfer device 12 is connected to a signal line known in the art as a bit line 16 (also known in the art as a digit line). With the memory cell 10 components connected in this manner, it is apparent that the word line 18 controls access to the storage capacitor 14 by allowing or preventing the signal (representing a logic "0" or a logic "1") carried on the bit line 16 to be written to or read from the storage capacitor 14. Thus, each cell 10 contains one bit of data (i.e., a logic "0" or logic "1").

A typical DRAM circuit has input/output (I/O) transistors that allow data to be read from and written to a memory array using specific I/O data lines. Due to the DRAM memory array structure, I/O data line lengths will vary. This occurs because a particular I/O data line is coupled to an individual memory module that can be located in one of various locations within the memory array. The capacitance on an individual I/O line varies with the length of the data line. The longer the I/O data line, the greater the capacitance of the I/O data line and the greater amount of time required before data transmitted on the I/O can be sensed.

FIG. 2 illustrates a conventional DRAM circuit 100. DRAM circuit 100 includes DRAM memory array 110, datapath 120, delay circuit 130, combinatorial logic circuit 140 and output pads 150. Memory array 110 includes individual DRAM memory modules 112, 114, 116 and 118 that possess a certain amount of memory, for example 512 Kb. The memory array 110 may contain more or less memory modules. Moreover, the size of each module may contain more or less memory than illustrated. Each memory module 112, 114, 116, 118 is connected to a data sense amplifier (DSA), such as for example, DSAs 122 and 124, in datapath 120 by I/O data lines.

As illustrated, due to an alignment of memory modules, the I/O data lines 113 for memory module 112 are longer than the I/O data lines 119 for memory module 118. The difference in length is due to the fact that memory module 112 is farther away from the data sense amplifiers than memory module 118. Consequently, the capacitance of the I/O data lines 113 (e.g., 0.8-1.2 pf, typically around 1 pf) connected to memory module 112 is greater than the capacitance of the I/O pair tine 119 (e.g., 0.4-0.8 pf, typically around 0.6 pf) connected to memory module 118. A threshold distance between I/O data lines which is considered-short or long is dependent upon various factors that include e.g., speed, current, layout, process and voltage.

Delay circuit 130, which includes delay device 132, is coupled to an enable line of each data sense amplifier and controls the timing of when data is received by the data sense amplifiers from an I/O data line. The length of delay produced by delay circuit 130 before enabling all data sense amplifiers is associated with the memory module with the longest I/O data lines, in this case memory module 112. Thus, each I/O data line, regardless of its length, has the same delay (i.e., the delay associated with memory module 112 and I/O data lines 113).

Because transmissions on all the I/O data lines are given the same amount of delay, longer I/O data lines, i.e., 113, experience an acceptable change in voltage (delta V) of approximately 300 mV as illustrated in FIG. 5. Shorter I/O data lines; however, experience a delta V equal to a full rail voltage, which results in unnecessary power consumption.

Once data is sensed by the sense amplifiers, i.e., DSAs 122 and 124, the sensed data is transmitted to combinatorial logic circuit 140 via data lines. The data is subsequently sent to output pads 150 for use by a requesting device.

FIG. 5 illustrates the signal timing for DRAM circuit 100. At time t1, a chip select signal CS for all data sense amplifiers transitions from low to high. At time t2, the delay signal Hfflat produced by delay circuit 130 transitions from low to high, enabling all data sense amplifiers in datapath 120. Delay signal Hfflat is associated with and generated in accordance with the time required for the most capacitive I/O data lines, in this case the I/O data line 113. Delay signal Hfflat is used to transfer data from memory module 112 to DSA 124 within a given time period, for example 2 ns. At time t3, the delay signal Hfflat transitions from high to low. While the delay signal Hfflat is high, the delta V for the more capacitive I/O data lines is approximately 300 mv. However, the delta V for the less capacitive I/O data lines is a full rail voltage, which produces an unnecessary current draw for the less capacitive I/O data lines. At time t4, I/O pull up signal IOPU transitions from low to high in order to pull the I/O lines high.

As discussed above, in current designs all I/O data lines coming from a memory array are given equal separation time before being sensed by a datapath sense amplifier. The delay for transmission on the I/O lines affects the memory access time for the memory array. In addition, I/Os with a lower capacitance must remain on longer to accommodate the timing of more capacitive I/Os, resulting in excessive power consumption.

Thus, it is desirable to produce a memory device with reduced power consumption.

BRIEF SUMMARY OF THE INVENTION

The present invention provides a DRAM circuit that consumes less power during memory array access. The sense timing for an individual I/O data line connected to a memory array is dependent upon its length/capacitance. I/O data lines that are smaller in comparison to a predetermined length/capacitance are sensed before I/O data lines that are larger than the predetermined length/capacitance. This allows faster access from parts of the memory array connected with a smaller I/O data line.

By sensing an I/O data line based on its length/capacitance only the minimum required separation time for the I/O data line is utilized, current during array access and overall power consumption are both reduced. This sensing technique also permits faster back-to-back array accesses on less capacitive I/O data lines because the sensing of the I/O data lines are controlled independently of the sensing of the other I/O data lines.

BRIEF DESCRIPTION OF THE DRAWINGS

The foregoing and other advantages and features of the invention will become more apparent from the detailed description of exemplary embodiments provided below with reference to the accompanying drawings in which.

DETAILED DESCRIPTION OF THE INVENTION

In the following detailed description, reference is made to the accompanying drawings, which are a part of the specification, and in which is shown by way of illustration various embodiments whereby the invention may be practiced. These embodiments are described in sufficient detail to enable those skilled in the art to make and use of the invention. It is to be understood that other embodiments may be utilized, and that structural, logical, and electrical changes, as well as changes in the materials used, may be made without departing from the spirit and scope of the present invention.

Figure 3:
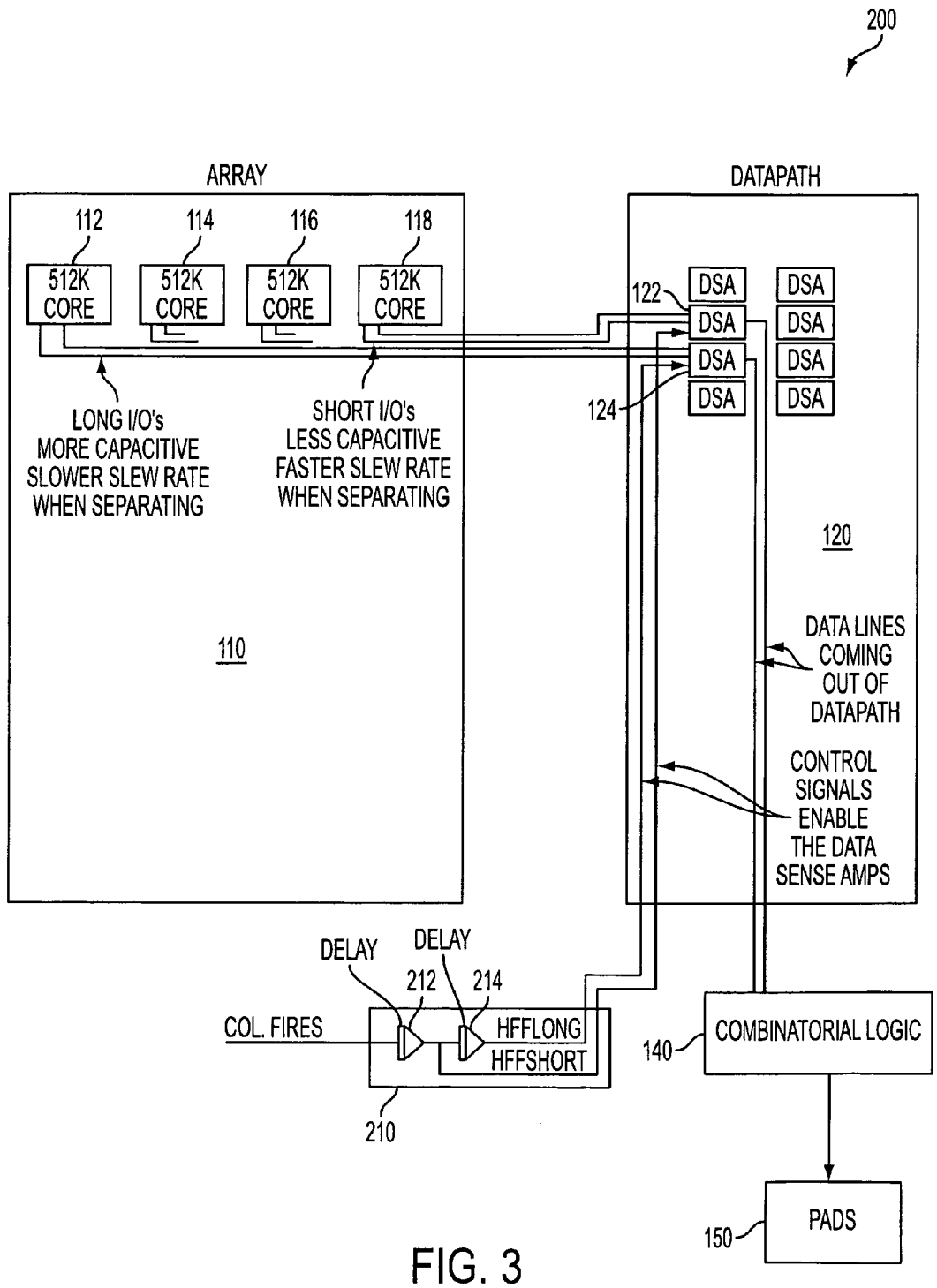
FIG. 3 is an exemplary DRAM circuit according to an embodiment of the present invention.

FIG. 3 illustrates an exemplary DRAM circuit 200 according to an embodiment of the present invention. DRAM circuit 200 is similar to DRAM circuit 100 and includes memory array 110, datapath 120, combinatorial logic circuit 140 and output pads 150. However delay circuit 130 (FIG. 1) is replaced with delay circuit 210 constructed in accordance with the invention.

Delay circuit 210 has multiple delay devices, i.e., delay devices 212 and 214, which are used to control the timing of when data is received and sensed by the data sense amplifiers from respective I/O data lines. Instead of delaying all data sense amplifiers based on the longest I/O data lines, the delay timing for the sense amplifiers are divided into stages that allow shorter I/O data lines to be sensed sooner than longer I/O data lines.

With staged delays, delay circuit 210 produces multiple delay times. For example, because memory module 112 has long I/O data lines (in comparison to the other I/O data lines), a longer delay is required before its associated data sense amplifier 124 should be enabled. Accordingly, the enable line for data sense amplifier 124 receives a delay signal HffLong that enables data sense amplifier 124 according to a timing delay necessary for longer, more capacitive I/O data lines. The delay signal HffLong is created by combining the timing delay produced by both delay devices 212 and 214. The determination of which data line receives which delay signal (HffLong or HffShort) can be determined at various stages in design, for example fabrication, testing, etc.

Because memory module 118 has short I/O data lines, a shorter delay (in comparison to the other I/O data lines), is required before the data sense amplifier 122 is enabled. Accordingly, the enable line for data sense amplifier 122 receives a delay signal HffShort, which enables data sense amplifier 122 according to a timing delay necessary for shorter, less capacitive I/O lines. The delay signal HffShort is created by delay device 212 only. Data is output from the data sense amplifiers 122 and 124 to output pads 150 as previously discussed.

Figure 4:
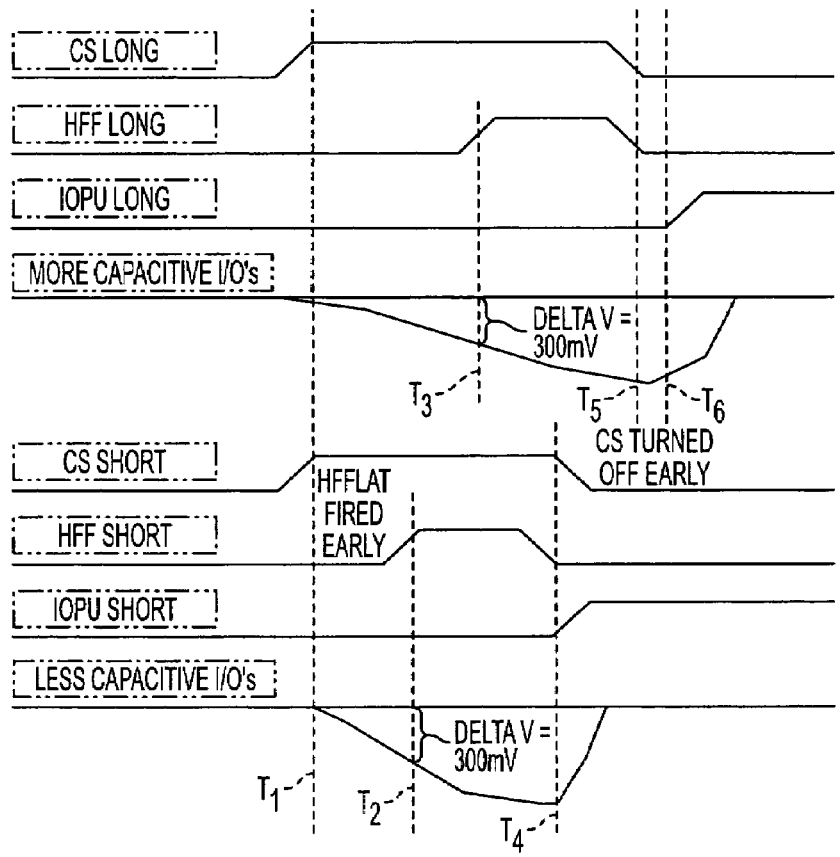
FIG. 4 is a timing diagram for sensing I/O lines in the FIG. 3 circuit according to the present invention.

FIG. 4 illustrates exemplary signal timing for DRAM circuit 200. At time t1, chip select signals CS Short and CS Long transition from low to high. At time t2, the delay signal HffShort produced by delay device 212 of delay circuit 210 transitions from low to high, enabling the sense amplifiers in datapath 120 connected to the shorter, less capacitive I/O lines pairs. At time t3, the delay signal HffLong produced by delay devices 212 and 214 of delay circuit 210 transitions from low to high, enabling the sense amplifiers in datapath 120 connected to the longer, more capacitive I/O lines pairs. At time t4, the delay signal HffShort transitions from high to low since data transfer to data sense amplifier 122 has completed. Also at time t4, the chip select signal CS Short for the data sense amplifiers coupled to delay circuit 210 by delay signal HffShort, i.e., data sense amplifier 122, transitions from high to low, and I/O pull up signal IOPU Short transitions from low to high in order to pull the shorter, less capacitive I/O lines high. At time t5, the delay signal HffLong transitions from high to low once data transfer to data sense amplifier 124 is complete. Also at time t5, the chip select signal CS Long for the data sense amplifiers coupled to delay circuit 210 by delay signal HffLong, i.e., data sense amplifier 124, transitions from high to low. At time t6, I/O pull up signal IOPU Long transitions from low to high in order to pull the longer, more capacitive I/O data lines high.

Figure 5:
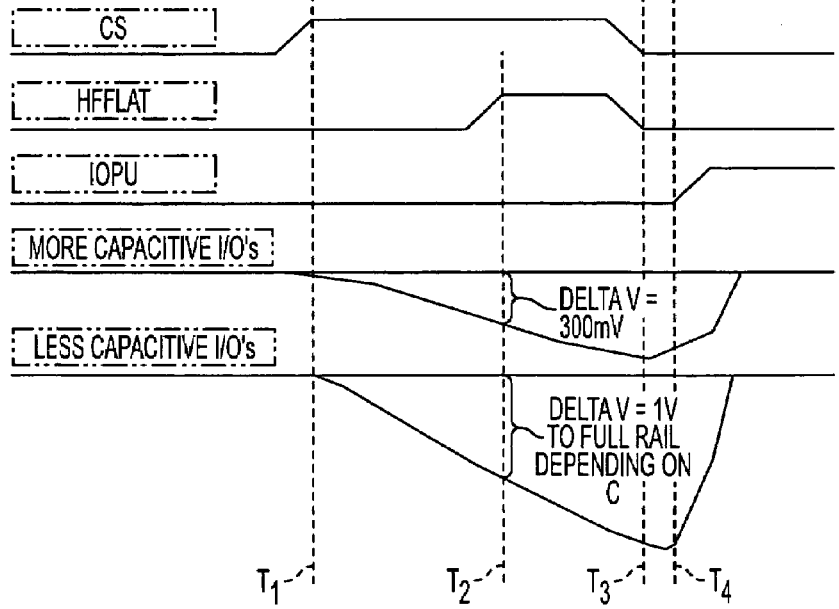
FIG. 5 is a timing diagram for sensing I/O lines according for a conventional DRAM circuit.

In utilizing multiple delay signals, HffShort and HffLong, sensing of those I/O data lines that are shorter is not delayed for an unnecessary amount of time (which as discussed above with regard to FIG. 5 leads to an increased current draw during memory access and increased power consumption). By sensing shorter, less capacitive I/O data lines independently of the longer, more capacitive I/O data lines, the delta V for the more capacitive I/O data lines and less capacitive I/O data lines are both approximately 300 mv, which is desirable (in comparison to the prior art). Consequently, the current draw for the less capacitive I/O data lines is thereby reduced.

Figure 1:
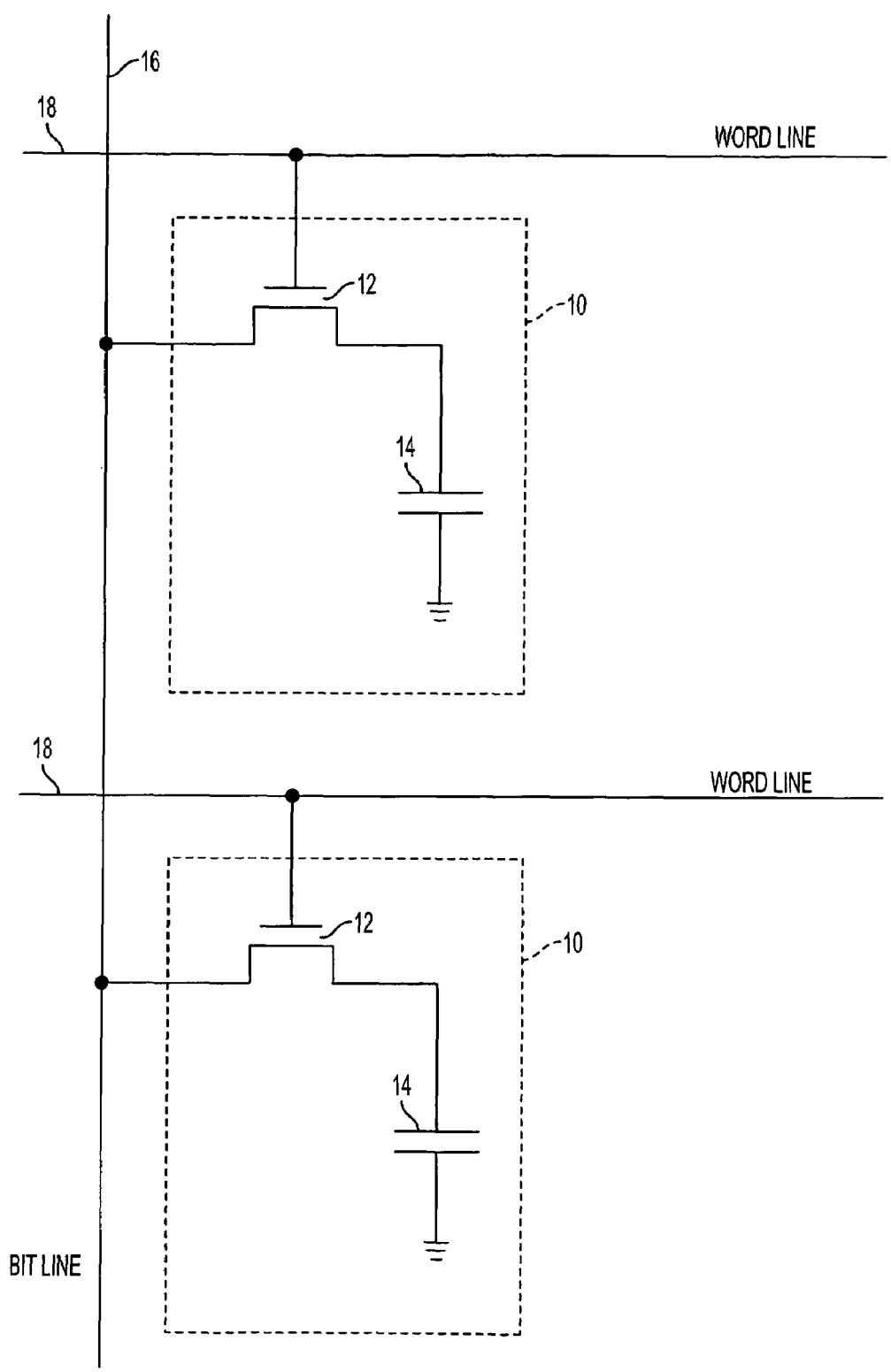
FIG. 1 is a circuit diagram illustrating conventional dynamic random access memory (DRAM) cells.
Figure 2:
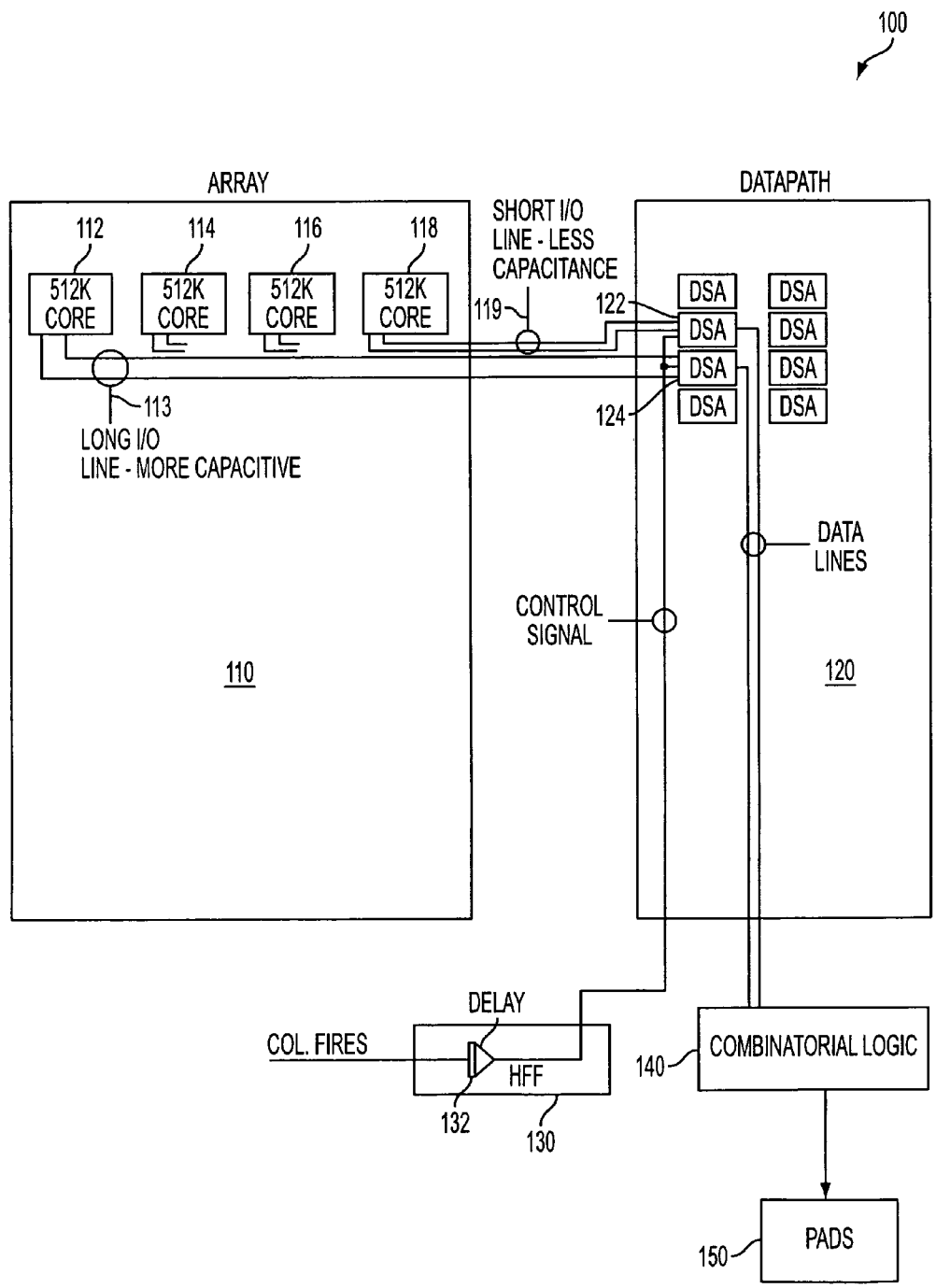
FIG. 2 is a conventional DRAM circuit showing input/output lines.
Figure 6:
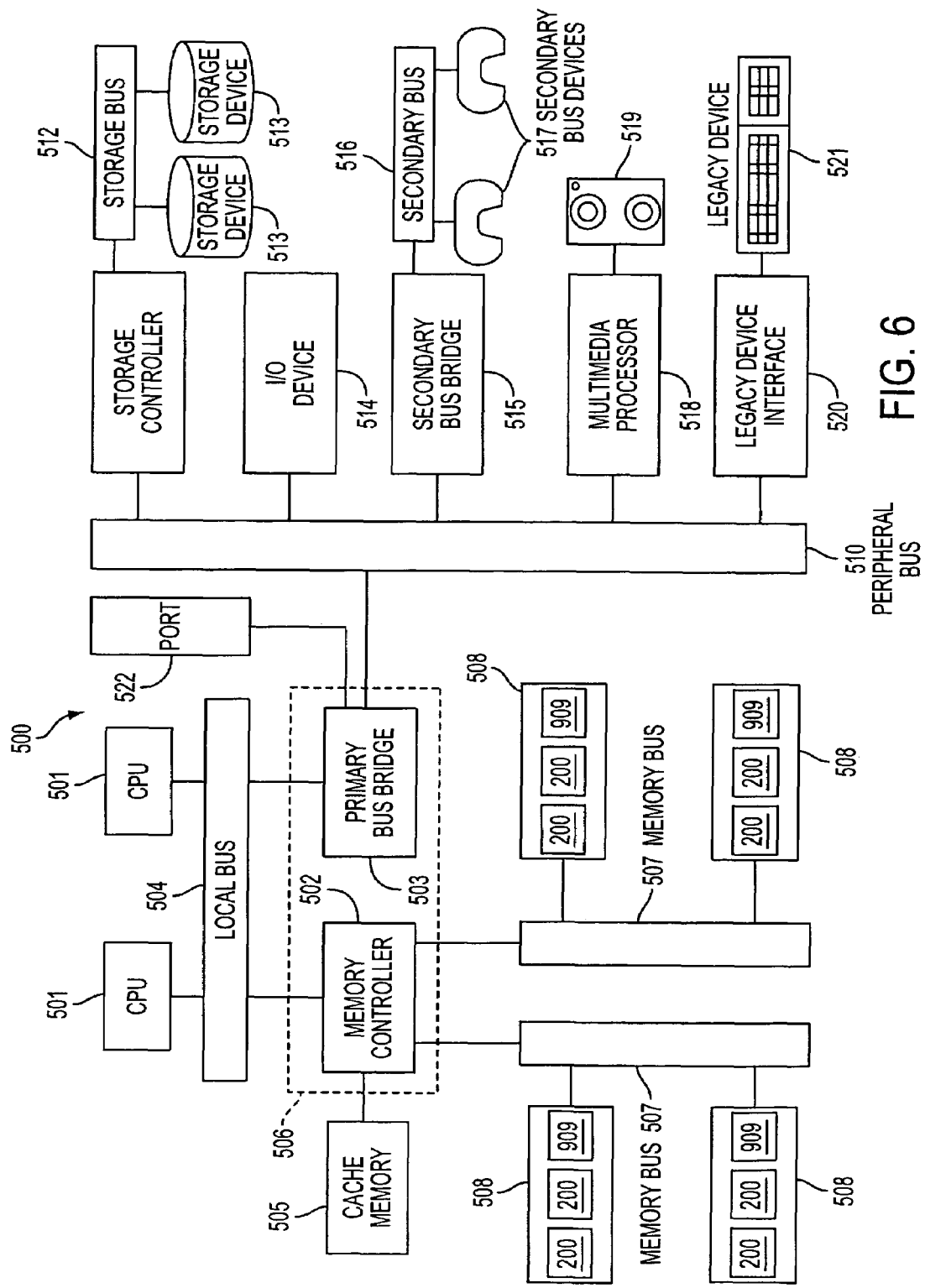
FIG. 6 is a processor system using a FIG. 3 DRAM circuit.

FIG. 6 illustrates an exemplary processing system 500 that utilizes a DRAM memory device 200 in accordance with the embodiments of the present invention disclosed above in FIGS. 1-3. FIG. 4 depicts an exemplary personal computer or work station architecture. The processing system 500 includes one or more processors 501 coupled to a local bus 504. A memory controller 502 and a primary bus bridge 503 are also coupled to the local bus 504. The processing system 500 may include multiple memory controllers 502 and/or multiple primary bus bridges 503. The memory controller 502 and the primary bus bridge 503 may be integrated as a single device 506.

The memory controller 502 is also coupled to one or more memory buses 507. Each memory bus accepts memory components 508 that include at least one memory device 200. The memory components 508 may be a memory card or a memory module. Examples of memory modules include single inline memory modules SIMMs and dual inline memory modules DIMMs. The memory components 508 may include one or more additional devices 509. For example, in a SIMM or DIMM, the additional device 509 might be a configuration memory, such as serial presences detect SPD memory. The memory controller 502 may also be coupled to a cache memory 505. The cache memory 505 may be the only cache memory in the processing system. Alternatively, other devices, for example, processors 501 may also include cache memories, which may form a cache hierarchy with cache memory 505. If the processing system 500 includes peripherals or controllers, which are bus masters or which support direct memory access DMA, the memory controller 502 may implement a cache coherency protocol. If the memory controller 502 is coupled to a plurality of memory buses 516, each memory bus 516 may be operated in parallel, or different address ranges may be mapped to different memory buses 507.

The primary bus bridge 503 is coupled to at least one peripheral bus 510. Various devices, such as peripherals or additional bus bridges may be coupled to the peripheral bus 510. These devices may include a storage controller 511, a miscellaneous I/O device 514, a secondary bus bridge 515, a multimedia processor 518, and a legacy device interface 520. The primary bus bridge 503 may also be coupled to one or more special purpose high speed ports 522. In a personal computer, for example, the special purpose port might be the Accelerated Graphics Port AGP, used to couple a high performance video card to the processing system 500.

The storage controller 511 couples one or more storage devices 513, via a storage bus 512, to the peripheral bus 510. For example, the storage controller 511 may be a SCSI controller and storage devices 513 may be SCSI discs. The I/O device 514 may be any type of peripheral. For example, the I/O device 514 may be a local area network interface, such as an Ethernet card. The secondary bus bridge may be used to interface additional devices via another bus to the processing system. For example, the secondary bus bridge may be a universal serial port USB controller used to couple USB devices 517 via to the processing system 500. The multimedia processor 518 may be a sound card, a video capture card, or any other type of media interface, which may also be coupled to one additional device such as speakers 519. The legacy device interface 520 is used to couple legacy devices, for example, older style keyboards and mice, to the processing system 500.

The processing system 500 illustrated in FIG. 6 is only an exemplary processing system with which the invention may be used. While FIG. 3 illustrates a processing architecture especially suitable for a general purpose computer, such as a personal computer or a workstation, it should be recognized that well known modifications could be made to configure the processing system 500 to become more suitable for use in a variety of applications. For example, many electronic devices that require processing may be implemented using a simpler architecture that relies on a CPU 501 coupled to memory components 508 and/or memory buffer devices 504. These electronic devices may include, but are not limited to audio/video processors and recorders, gaming consoles, digital television sets, wired or wireless telephones, navigation devices (including system based on the global positioning system GPS and/or inertial navigation), and digital cameras and/or recorders. The modifications may include, for example, elimination of unnecessary components, addition of specialized devices or circuits, and/or integration of a plurality of devices.

While the invention has been described and illustrated with reference to specific exemplary embodiments, it should be understood that many modifications and substitutions could be made without departing from the spirit and scope of the invention. Accordingly, the invention is not to be considered as limited by the foregoing description but is only limited by the scope of the appended claims.

What is claimed as new and desired to be protected by Letters Patent of the United States is:

1. A column output delay circuit for a memory device comprising:
    a first delay device for delaying a column enable signal to a first sense amplifier of said memory device for a first period of time based on a capacitance of a first input/output signal line; and
    a second delay device for delaying a column enable signal to a second sense amplifier of said memory device for a second period of time, different from said first period of time, based on a capacitance of a second input/output signal line.

2. The circuit of claim 1, wherein said first input/output signal line has less capacitance than said second input/output signal line.

3. The circuit of claim 2, wherein said first delay device is coupled in series to said second delay device to delay the column enable signal for the second period of time.

4. A column output delay circuit for a memory device comprising:
    a first delay device and a second delay device,
    wherein said first delay device is coupled to a first sense amplifier,
    wherein said first sense amplifier is coupled to a first input/output line having a first capacitance,
    wherein said second delay device is coupled to a second sense amplifier,
    wherein said second sense amplifier is coupled to a second input/output line having a second capacitance.

5. The circuit of claim 4, wherein said first input/output signal line has less capacitance than said second input/output signal line.

6. The circuit of claim 5, wherein said first delay device is coupled in series to said second delay device.

7. A memory device comprising:
    a memory array;
    a first sense amplifier coupled to the memory array by a first input/output signal line, said first input/output signal line having a first capacitance;
    a second sense amplifier coupled to the memory array by a second input/output signal line, said second input/output signal line having a second capacitance; and a column output delay circuit comprising a first delay device coupled to provide a column enable signal to said first sense amplifier and a second delay device coupled to provide a column enable signal to said second sense amplifier.

8. The device of claim 7 further comprising:
a combinatorial logic circuit coupled to the first sense amplifier and second sense amplifier; and
output data pads coupled to the combinatorial logic circuit.

9. The device of claim 7 wherein said first input/output signal line has less capacitance than said second input/output signal line.

10. The device of claim 9, wherein said first delay device is coupled in series to said second delay device.

11. The device of claim 7, wherein the first input/output signal line is coupled to a first memory module within said memory array, wherein the second input/output signal line is coupled to a second memory module within said memory array, and wherein said second input/output signal line is longer than said first input/output signal line.

12. The device of claim 11, wherein said first delay device is coupled in series to said second delay device.

13. A processor system comprising:
a processor; and
a memory device, said memory device comprising:
a memory array,
a first sense amplifier coupled to the memory array by a first input/output signal line, said first input/output signal line having a first capacitance,
a second sense amplifier coupled to the memory array by a second input/output signal line, said second input/output signal line having a second capacitance, and
a column output delay circuit comprising a first delay device coupled to said first sense amplifier and a second delay device coupled to said second sense amplifier, said first and second delay devices causing said first and second sense amplifiers to operate at different times.

14. The system of claim 13 wherein said first input/output signal line has less capacitance than said second input/output signal line.

15. The system of claim 14, wherein said first delay device is coupled in series to said second delay device.

16. The system of claim 13, wherein the first input/output signal line is coupled to a first memory module within said memory array, wherein the second input/output signal line is coupled to a second memory module within said memory array, and wherein said second input/output signal line is longer than said first input/output signal line.

17. The system of claim 16, wherein said first delay device is coupled in series to said second delay device.

* * * * *